United States Patent
Dokko

(10) Patent No.: US 11,905,955 B1
(45) Date of Patent: Feb. 20, 2024

(54) EXTENDING LIFE CYCLES OF VACUUM PUMPS USED IN MANUFACTURING PROCESSES

(71) Applicant: Yoshinori Christopher Dokko, Hayward, CA (US)

(72) Inventor: Yoshinori Christopher Dokko, Hayward, CA (US)

(73) Assignee: Kashiyama Industries, Ltd., Saku (JP)

( * ) Notice: Subject to any disclaimer, the term of this patent is extended or adjusted under 35 U.S.C. 154(b) by 541 days.

(21) Appl. No.: 16/864,885

(22) Filed: May 1, 2020

Related U.S. Application Data

(60) Provisional application No. 62/841,772, filed on May 1, 2019.

(51) Int. Cl.
    *F04C 29/00* (2006.01)
    *F04C 19/00* (2006.01)
    *H01L 21/67* (2006.01)

(52) U.S. Cl.
    CPC ........ *F04C 19/005* (2013.01); *F04C 29/0092* (2013.01); *F04C 2220/30* (2013.01); *H01L 21/67011* (2013.01); *H01L 2224/75102* (2013.01)

(58) Field of Classification Search
    CPC ................ F04C 19/005; F04C 29/0092; F04C 2220/30; H01L 21/67011; H01L 2224/75102
    See application file for complete search history.

(56) References Cited

FOREIGN PATENT DOCUMENTS

| WO | WO-2008099206 A1 * | 8/2008 | ............. B01D 53/68 |
| WO | WO-2017013383 A1 * | 1/2017 | ............... A62C 4/00 |

* cited by examiner

*Primary Examiner* — Ermias T Woldegeorgis

(74) *Attorney, Agent, or Firm* — Adibi IP Group, PC; Amir V. Adibi; Andrew C. Palmer

(57) ABSTRACT

An abatement system with liquid-ring pump maintains an exhaust line at a negative pressure during operation of a vacuum pump. The vacuum pump operates to exhaust process gas and by-products from a process chamber through a foreline. The vacuum pump exhausts the process gas to the abatement system with liquid-ring pump through the exhaust line. The overall life of the vacuum pump is increased significantly because the exhaust line is maintained at a negative pressure which reduces precipitation of gases in the vacuum pump thereby reducing by-product accumulation and damage to the vacuum pump. The liquid-ring pump receives the exhaust process gas from the vacuum pump and outputs gas to a burn chamber and liquid to a recirculation tank. Liquid is recycled through the liquid-ring pump thereby reducing accumulation of precipitated gas and by-product. The overall life of the liquid-ring pump and vacuum pump are increased.

20 Claims, 10 Drawing Sheets

MANUFACTURING FACILITY WITH EXHAUST MANAGEMENT SYSTEM

MANUFACTURING FACILITY WITH EXHAUST MANAGEMENT SYSTEM

MANUFACTURING FACILITY WITH EXHAUST
MANAGEMENT SYSTEM

MANUFACTURING FACILITY WITH EXHAUST MANAGEMENT SYSTEM

MANUFACTURING FACILITY WITH EXHAUST
MANAGEMENT SYSTEM
(FIRST EMBODIMENT)

MANUFACTURING FACILITY WITH EXHAUST
MANAGEMENT SYSTEM
(SECOND EMBODIMENT)

MANUFACTURING FACILITY WITH EXHAUST
MANAGEMENT SYSTEM
(THIRD EMBODIMENT)

MANUFACTURING FACILITY WITH EXHAUST
MANAGEMENT SYSTEM (FOURTH EMBODIMENT)

MANUFACTURING FACILITY WITH EXHAUST MANAGEMENT
SYSTEM ON SAME FLOOR AS PROCESSING (FIFTH EMBODIMENT)

EXTENDING LIFE CYCLES OF VACUUM PUMPS USED IN MANUFACTURING PROCESSES

CROSS REFERENCE TO RELATED APPLICATIONS

This application claims the benefit under 35 U.S.C. § 119 from U.S. Provisional Patent Application Ser. No. 62/841,772, entitled "Extending Lifecycles Of Vacuum Pumps Used In Manufacturing Processes," filed on May 1, 2019, the subject matter of which is incorporated herein by reference.

TECHNICAL FIELD

The described embodiments relate generally to manufacturing processes, and more particularly, to exhaust management systems and techniques in manufacturing processes.

BACKGROUND INFORMATION

Chemical Vapor Deposition (CVD) and Physical Vapor Deposition (PVD) are common semiconductor manufacturing processes. Semiconductor manufacturing facilities that perform. CVD and PVD often have process chambers where the CVD and/or PVD process is performed during fabrication of integrated circuits. Typically, the process chamber must be under a vacuum condition in order for the process to be carried out. A vacuum condition is a condition where the pressure in the chamber is less than atmospheric pressure.

Vacuum pumps and abatement systems are commonly used to generate the vacuum and handle unused process gas and by-products. Vacuum pumps are typically employed to generate the necessary vacuum condition and remove unused process gases and by-products from the process chamber. The abatement systems treat the removed unused gases and by-products so that these unused gases and by-products can be safely released and disposed of.

One type of vacuum pump is a dry vacuum pump. Dry vacuum pumps do not involve oil or liquid in their operation. During operation of dry vacuum pumps, by-product tends to accumulate in vacuum pumps. After enough build up occurs, vacuum pumps become damaged or no longer operate as effectively. These damaged or ineffective vacuum pumps require maintenance or replacement. In the case of a large facility with many vacuum pumps involved in operations, vacuum pump replacement and maintenance becomes very costly. A solution that overcomes these challenges is desired.

SUMMARY

An abatement system with liquid-ring pump maintains an exhaust line at a negative pressure during operation of a vacuum pump. The vacuum pump operates to exhaust process gas and by-products from a process chamber through a foreline. The vacuum pump exhausts the process gas to the abatement system with liquid-ring pump through the exhaust line. The overall life of the vacuum pump is increased significantly because the exhaust line is maintained at a negative pressure which reduces precipitation of gases in the vacuum pump thereby reducing by-product accumulation and damage to the vacuum pump. The liquid-ring pump receives the exhaust process gas from the vacuum pump and outputs gas to a burn chamber and liquid to a recirculation tank. Liquid is recycled through the liquid-ring pump thereby reducing accumulation of precipitated gas and by-product. The overall life of the liquid-ring pump and vacuum pump are increased.

In one embodiment, the abatement system with liquid-ring pump has a liquid-ring pump, a burn chamber, and a recirculation tank. The liquid-ring pump includes a first inlet port, a second inlet port, a first outlet port, and second outlet port. The first inlet port of the liquid-ring pump receives the exhaust process gas from the vacuum pump. The liquid-ring pump includes a separator that outputs the gas portion to the burn chamber and liquid portion to the tank. Liquid in the tank is recycled back into the liquid-ring pump through the second inlet port. This recirculation maintains the liquid-ring pump from accumulating build up of precipitated process gas and by-product.

In another embodiment, the abatement system with liquid-ring pump has a liquid-ring pump, a burn chamber, and a recirculation tank. The liquid-ring pump includes a first inlet port, a second inlet port, a first outlet port, and a second outlet port. The first inlet port of the liquid-ring pump receives the exhaust process gas from the vacuum pump. The liquid-ring pump includes a separator that outputs both the gas portion and liquid portion to the burn chamber. Liquid in the tank is recycled back into the liquid-ring pump through the second inlet port. This recirculation maintains the liquid-ring pump from accumulating build up of precipitated process gas and by-product.

In yet another embodiment, the abatement system with liquid-ring pump has a liquid-ring pump, a burn chamber, and a recirculation tank. The liquid-ring pump includes a first inlet port, a second inlet port, a first outlet port, and a second outlet port. The first inlet port of the liquid-ring pump receives the exhaust process gas from the vacuum pump. The liquid-ring pump includes a separator that either (1) outputs the gas portion to the burn chamber and liquid-portion to a tank, or (2) outputs both the gas portion and liquid portion to the burn chamber. Facility water is cycled into the liquid-ring pump through the second inlet port. This circulation maintains the liquid-ring pump from accumulating build up of precipitated process gas and by-product.

In accordance with at least one novel aspect, a novel method is employed to increase the life of a vacuum pump involved in exhausting gas from a process chamber used in a manufacturing facility. First, a vacuum condition is generated in the process chamber using the vacuum pump. The vacuum pump ha, an inlet port and an outlet port. The vacuum pump is coupled to extract gas from the process chamber and exhaust process gas through an exhaust line. Next, a negative pressure condition is generated along the exhaust line while process gas is exhausted from the vacuum pump. The process gas is exhausted from the process vacuum pump through the exhaust line and to a liquid-ring pump.

Further details and embodiments and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 1:
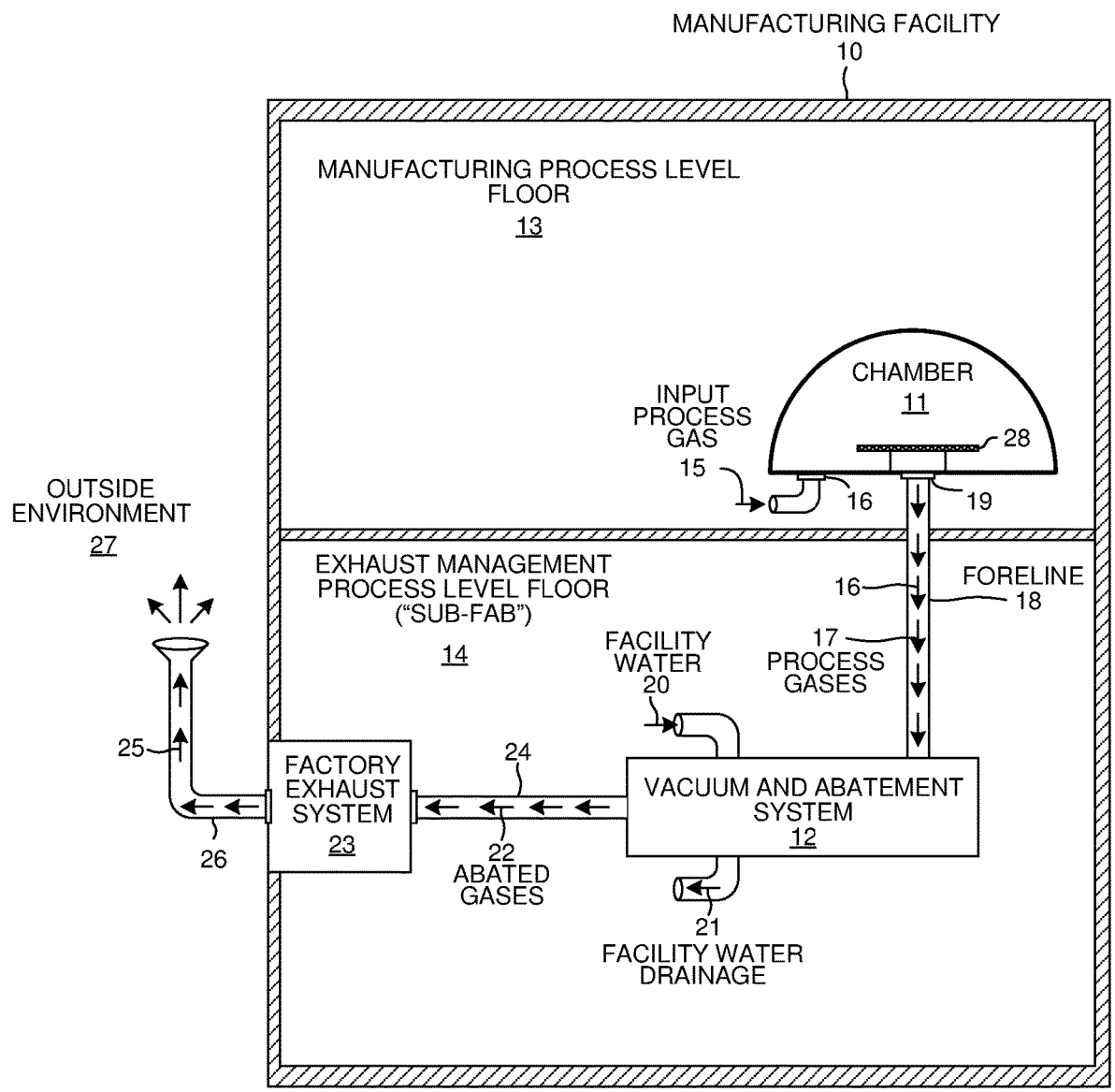
FIG. 1 is a high-level diagram of a manufacturing facility 10 that includes a chamber 11 in a vacuum and abatement system 12.
Figure 9:
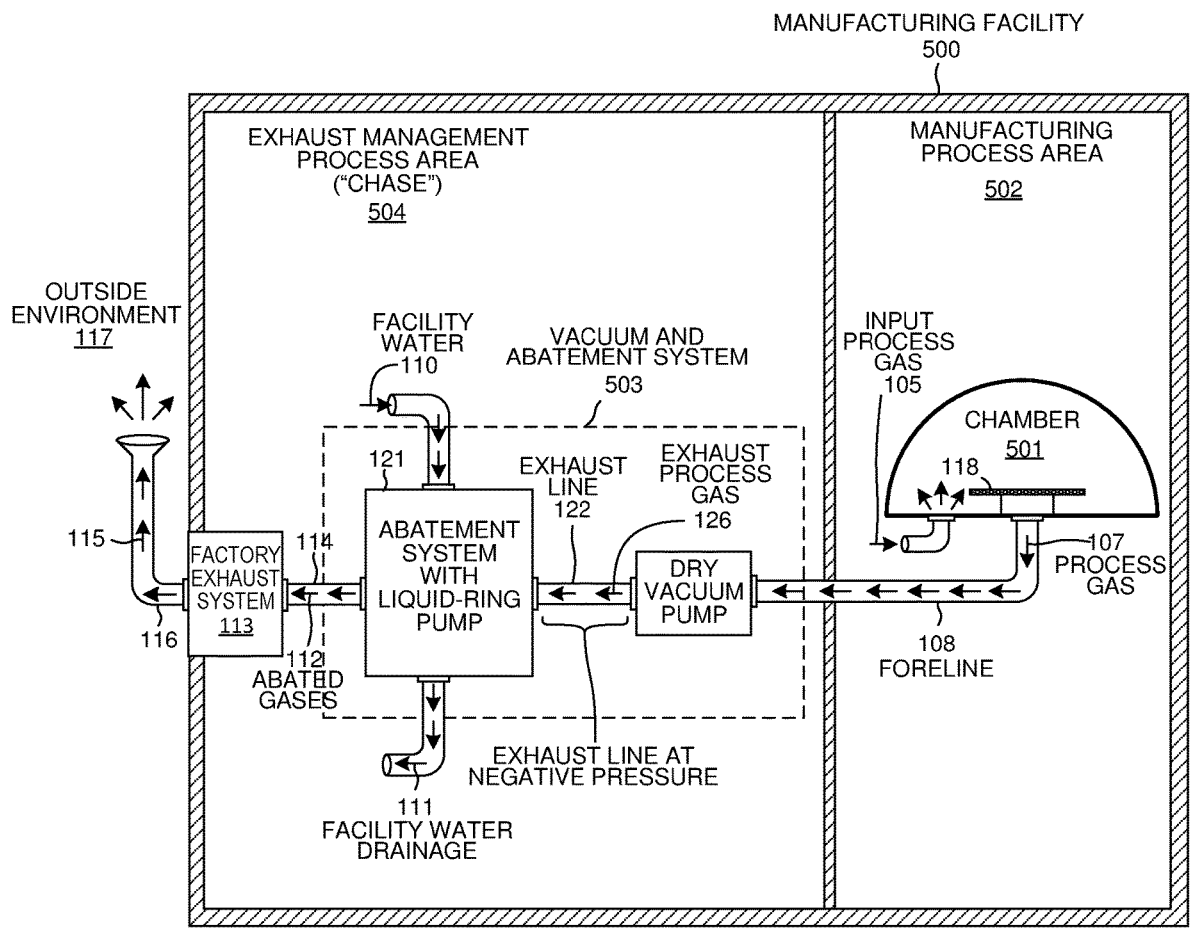
FIG. 9 is a high-level diagram of another embodiment of a manufacturing facility 500.

FIG. 1 is a high-level diagram of a manufacturing facility 10 that includes a chamber 11 in a vacuum and abatement system 12. The chamber 11 is a process or reaction chamber using a manufacturing process such as a CVD process, a PVD process, or another type of process that requires a vacuum condition within the process chamber 11. The manufacturing facility 10 has a manufacturing process level floor 13 and an exhaust management process level floor 14. The exhaust management process level floor 14 is commonly referred to as a "sub-fab" because the exhaust management process level floor 14 is below the manufacturing process level floor 13. When the exhaust management process area is adjacent to and on the same level as the process area, then the exhaust management process area is referred to as a. "chase". An example of a "chase" is shown in FIG. 9.

During the manufacturing process involving the process chamber 11, an input process gas 15 is supplied into an inlet port 16 of the process chamber 11. The vacuum and abatement system 12 generates a vacuum condition within the chamber 11. The vacuum condition is a necessary part of the reaction process occurring in the process chamber 11. During the process, process gas 17 is exhausted from the process c amber 11 through a vacuum foreline 18 via outlet port 19 of the process chamber 11. The foreline 18 is a pipe connected between the process chamber 11 on the manufacturing process level floor 13 and a vacuum of the vacuum and abatement system 12. The vacuum and abatement system 12 receives facility water 20 and outputs facility water drainage 21. Abated gases 22 are exhausted via the factory exhaust system 23 through a pipe 24. The factory exhaust system 23 exhausts the exhaust gases 25 through an exhaust pipe 26. In this fashion, the factory exhaust gases 25 exit the manufacturing facility 10 to the outside environment 27. In the example of FIG. 1, process chamber 11 includes a substrate 28 involved in a CVD manufacturing process. It is understood that process chamber 11 may be used in various types of other manufacturing processes where a vacuum condition is required for the manufacturing processes to occur in the process chamber 11.

Figure 2:
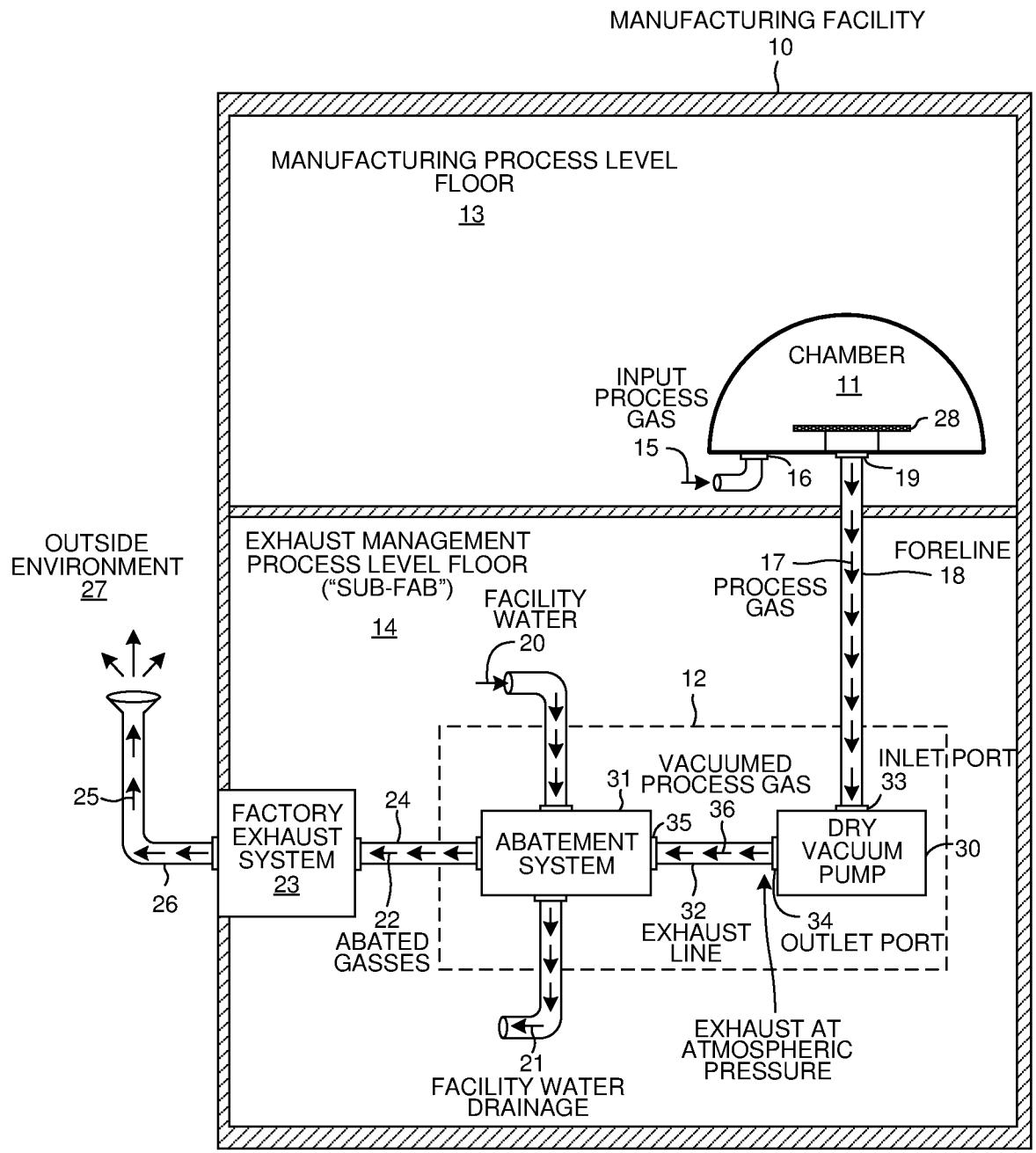
FIG. 2 is a high-level diagram of the manufacturing facility 10 that shows a more detailed view of the vacuum and abatement system 12.

FIG. 2 is a high-level diagram of the manufacturing facility 10 that shows a more detailed view of the vacuum and abatement system 12. The vacuum and abatement system 12 includes a vacuum pump 30 and an abatement system 31. In this embodiment, vacuum pump 30 is a dry vacuum pump. The dry vacuum pump 30 exhausts process gas 17 from the process chamber 11 via foreline 18. The dry vacuum pump 30 exhausts the vacuumed process gas 36 to the abatement system 31 through an exhaust line 32. The vacuum pump 30 has an inlet port 33 and an outlet port 34. The abatement system 31 has an inlet port 35 that receives vacuumed process gas 36 from the dry vacuum pump 30.

During operation of the vacuum and abatement system. 12, the vacuum foreline 18 and the inlet port 33 of the dry vacuum pump 30 are at less than atmospheric pressure. For example, the vacuum foreline 18 and the inlet port 33 of the dry vacuum pump 30 are at approximately $10^{-2}$ torr. On the other hand, the outlet port 34 of the vacuum pump 30 is at atmospheric pressure. The exhaust line 32 is also at atmospheric pressure. This causes process gas 17 and other by-products to precipitate at the outlet port 34 and along exhaust line 32. Additional precipitation occurs within the vacuum pump 30. This precipitation is undesirable because over time, the dry vacuum pump 30 requires maintenance and is possibly damaged due to the precipitation of the process gas 17 and by other potential by-products.

Figure 3:
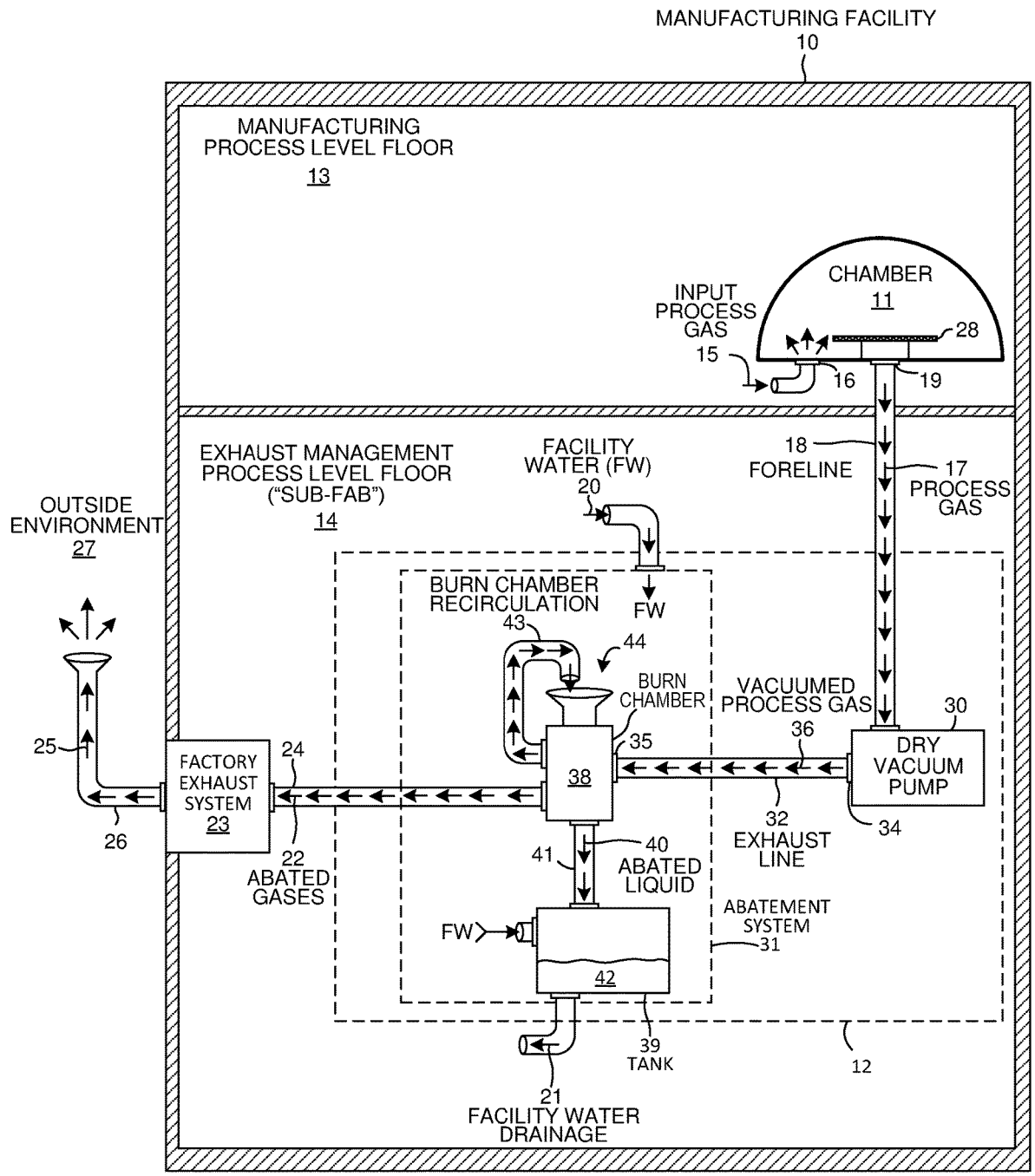
FIG. 3 is a high-level diagram of the manufacturing facility 10 showing a more detailed view of the abatement system 31.

FIG. 3 is a high-level diagram of the manufacturing facility 10 showing a more detailed view of the abatement system 31. The abatement system 31 includes a burn chamber 38 and a tank 39. Vacuumed process gas 36 flows from the dry vacuum pump 30 through the exhaust line 32 and into the burn chamber 38. The burn chamber 38 outputs abated gases 22 and abated liquid 40. The abated gases 22 are exhausted through the factory exhaust system 23 and into the environment 27. The abated liquid 40 is supplied to tank 39 via pipe 41. Tank 39 includes recirculation liquid 42 that is drained through the facility water drainage 21. The burn chamber 38 also outputs burn chamber recirculation through pipe 43 and back into the inlet port 44 of the burn chamber 38. Facility water 20 is supplied to tank 39 and to various other parts of the abatement system 31.

It is understood that various types of burn chambers and abatement systems are used in manufacturing facilities. The liquid 40 used in the process is typically water or peroxide but varies depending on the type of vacuum and abatement system employed. In one embodiment, the burn chamber 38 is a gas burn chamber. In another embodiment, the burn chamber 38 is a plasma burn chamber. In yet another embodiment, the burn chamber 38 is an electric burn chamber.

Figure 4:
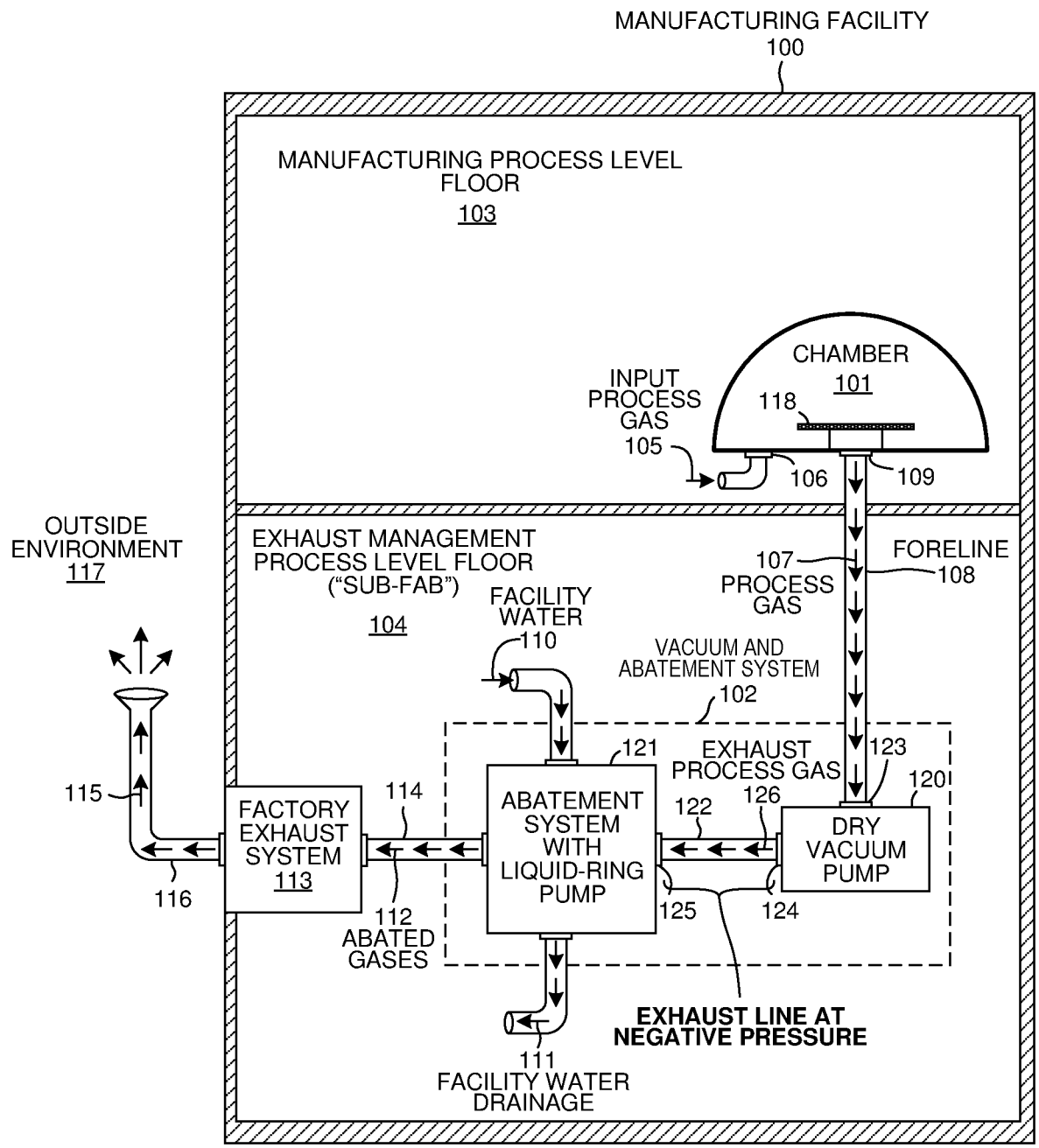
FIG. 4 is a high-level diagram of a manufacturing facility 100 having a chamber 101 and a novel vacuum and abatement system 102.

FIG. 4 is a high-level diagram of a manufacturing facility 100 having a chamber 101 and a novel vacuum and abatement system 102. The vacuum and abatement system 102 includes a dry vacuum pump 120. The dry vacuum pump 120 operates in a similar fashion as the vacuum pump 30 in FIG. 3; however, the exhaust line 122 is maintained at a negative pressure during operation of the dry vacuum pump 120. A negative pressure is a pressure that is below atmospheric pressure. The outlet port 124 of dry vacuum pump 120 is also maintained at a negative pressure during operation of the dry vacuum pump 120. In one example, the exhaust line 122 and the outlet port 124 of dry vacuum pump 120 is at 10-1 torr. The process chamber 101 is disposed within a manufacturing process level floor 103. The vacuum and abatement system 102 is part of the exhaust management process level floor 104. The exhaust management process level floor 104 is also referred to as a sub-fab.

During the manufacturing process, the chamber 101 is configured in a vacuum condition using the vacuum pump 120. Input process gas 105 is supplied to the process chamber 101 via inlet port 106. The dry vacuum pump 120 removes process gas 107 from chamber 101 via outlet port 109, thereby creating the vacuum condition within the process chamber 101. The process gas 107 flows from chamber 101, through the outlet port 109, through foreline 108, and into the dry vacuum pump 120 via the inlet port 123. The foreline 108 is maintained at a negative pressure. The process gas 107 that is vacuumed by the dry vacuum pump 120 is then exhausted through the exhaust line 122 via the outlet port 124 of the dry vacuum pump 120. The exhaust process gas 126 flows from the dry vacuum pump 120 through outlet port 124 through exhaust line 122 and into inlet port 125 of the abatement system with the liquid-ring pump 121. The liquid-ring pump within the abatement system 121 causes the exhaust line 122 to be maintained at a negative pressure during operation of the dry vacuum pump 120.

The abatement system with liquid-ring pump 121 receives facility water 110 and outputs facility water drainage 111. The abatement system with liquid-ring pump 121 exhausts abated gases 112 through exhaust line 114 and Into the factory exhaust system 113. The factory exhaust system 113 exhausts output gases 115 through pipe 116 and into the outside environment 117. The process chamber 101 is part of a CVD, PVD, or other type of manufacturing process that involves a vacuum condition within the chamber 101. A substrate 118 is shown in chamber 101 for explanatory purposes, but other non-semiconductor manufacturing processes may employ the novel vacuum and abatement system 102.

Figure 5:
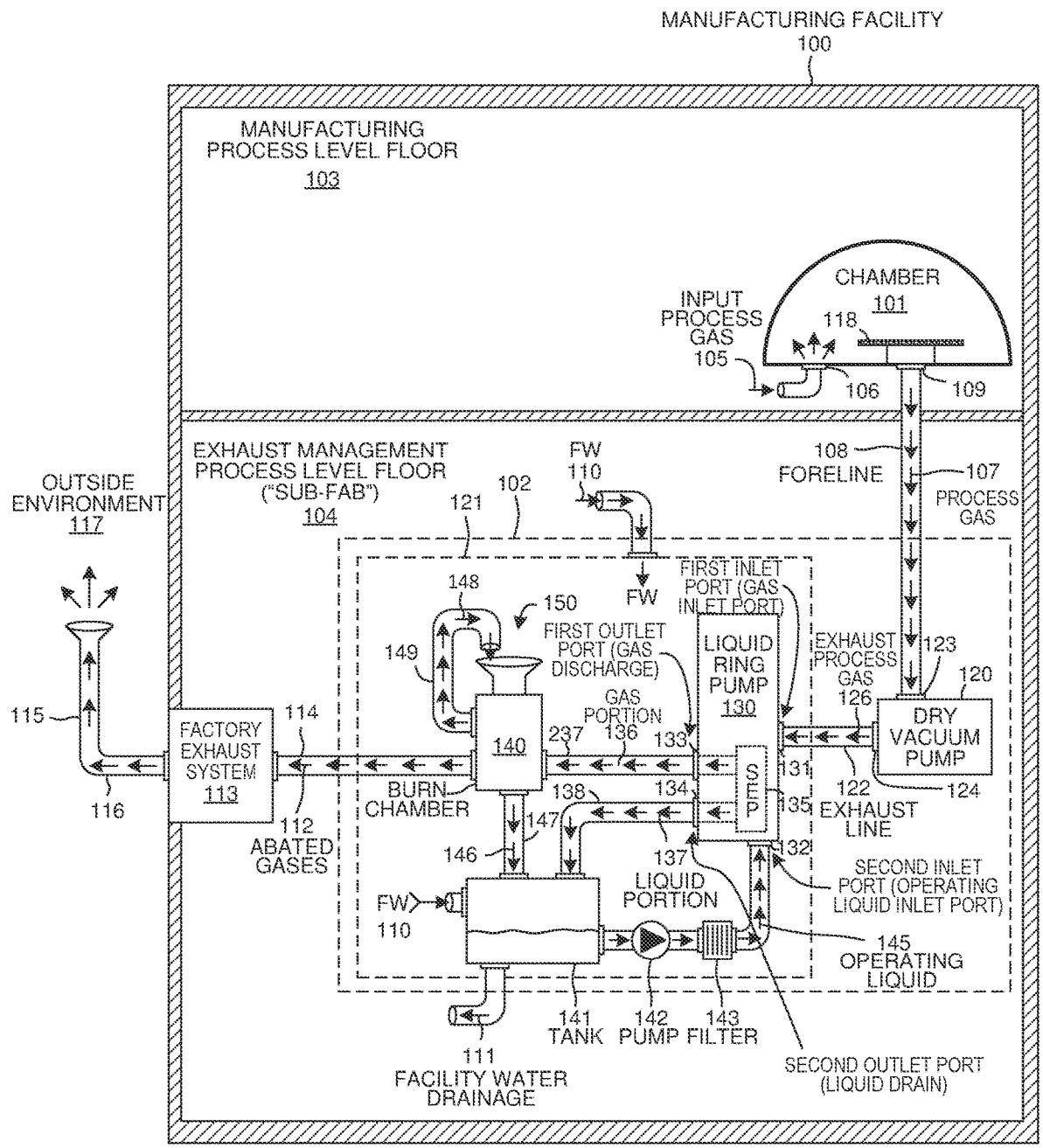
FIG. 5 is a high-level diagram of the manufacturing facility 100 showing a more detailed view of the abatement system with liquid-ring pump 121.

FIG. 5 is a high-level diagram of the manufacturing facility 100 showing a more detailed diagram of the abatement system with liquid-ring pump 121. The abatement system with the liquid-ring pump 121 comprises a liquid-ring pump 130, a burn chamber 140, a tank 141, a pump 142, and a filter 143. The liquid-ring pump 130 comprises a first inlet port 131, a second inlet port 132, a first outlet port 133, and a second outlet port 134. The first inlet port 131 is a gas inlet port that receives the exhaust process gas 126 supplied by the dry vacuum pump 120. The second inlet port 132 is an operating liquid inlet port that receives operating liquid 145. The first outlet port 133 is a gas discharge outlet port that outputs a gas portion 136 into pipe 237. The second outlet port 134 is a liquid drain outlet port that outputs a liquid portion 137 into pine 138. The burn chamber 140 receives the gas portion of process gases 136 and processes the gas portion 136, thereby outputting abated gases 112 through exhaust line 114 and outputting abated liquid 146 through pipe 147. The abated gases 112 are supplied to the factory exhaust system 113. The abated liquid 146 is supplied to a tank 141. The burn chamber 140 also outputs burn chamber recirculation 148 through pipe 149 and back into the inlet port 150 of the burn chamber 140.

During operation of the vacuum and abatement system 102, the exhaust line 122 is maintained at a negative pressure. Process gas 107 does not precipitate in the dry vacuum pump 120. Process gas 107 also does not precipitate at the outlet port 124 of the vacuum pump 120. The liquid-ring pump 130 also includes a separator 135 that separates the exhaust process gas 126 into a gas portion 136 and a liquid portion 137.

Figure 6:
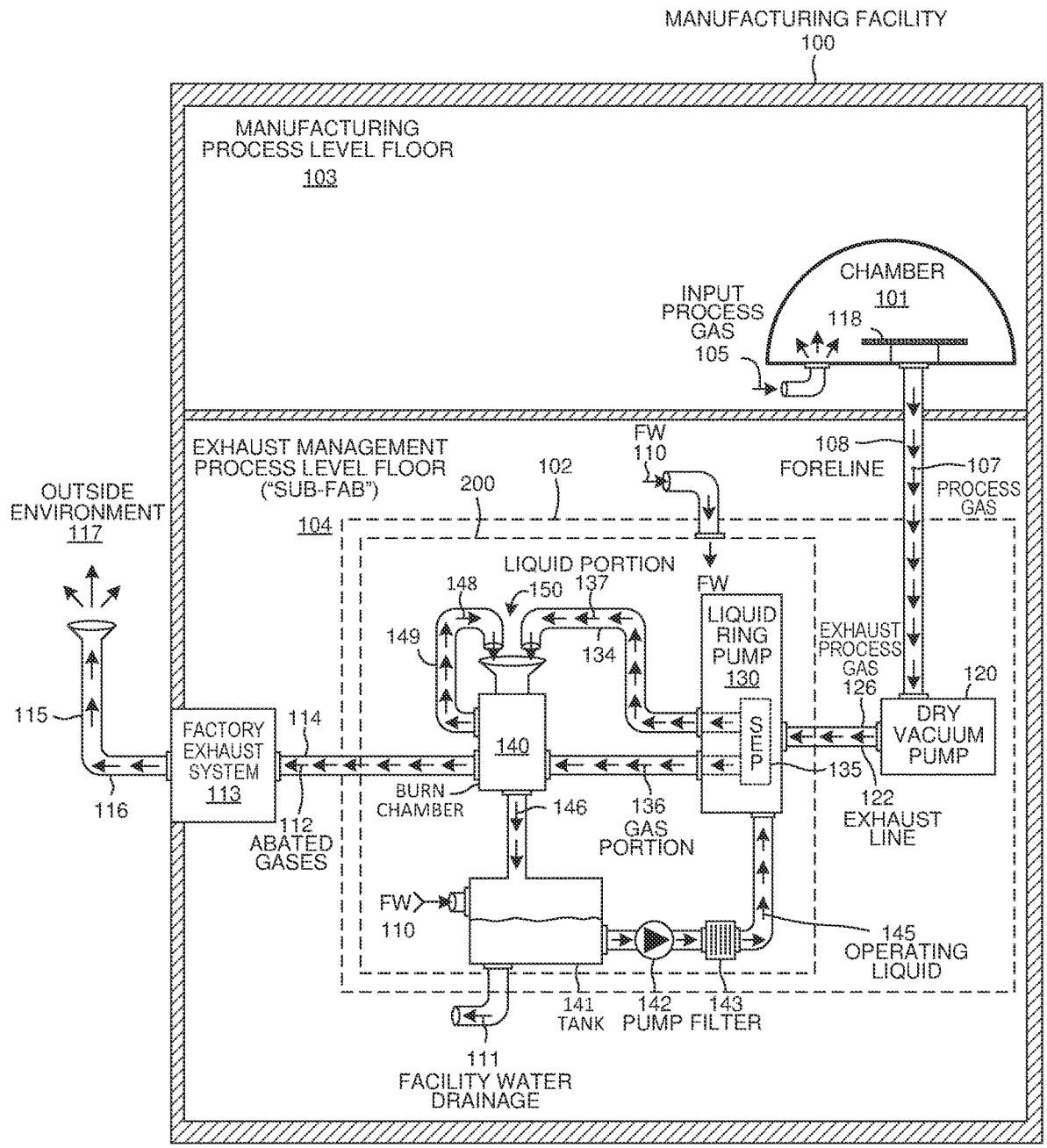
FIG. 6 is a high-level diagram of a manufacturing facility 100 that shows another embodiment of a novel abatement system 200.

FIG. 6 is a high-level diagram of a manufacturing facility 100 that shows another embodiment of a novel abatement system 200. The novel abatement system 200 is similar to the abatement system 121 shown in FIG. 5, except that the liquid portion 137 of exhaust process gas 126 is supplied to the inlet port 150 of the burn chamber 140 instead of being supplied to the tank 141. The liquid-ring pump 130 of FIG. 6 operates in a similar fashion as the liquid-ring pump 130 of FIG. 5. The burn chamber 140 processes the gas portion 136 and the liquid portion 137 that is output by the separator 135 of the liquid-ring pump 130. The burn chamber 140 outputs abated liquid 146 and supplies the abated liquid 146 to the tank 141. The burn chamber 140 outputs abated gases 112 and supplies abated gases 112 to the factory exhaust system 113 through the exhaust line 114.

Figure 7:
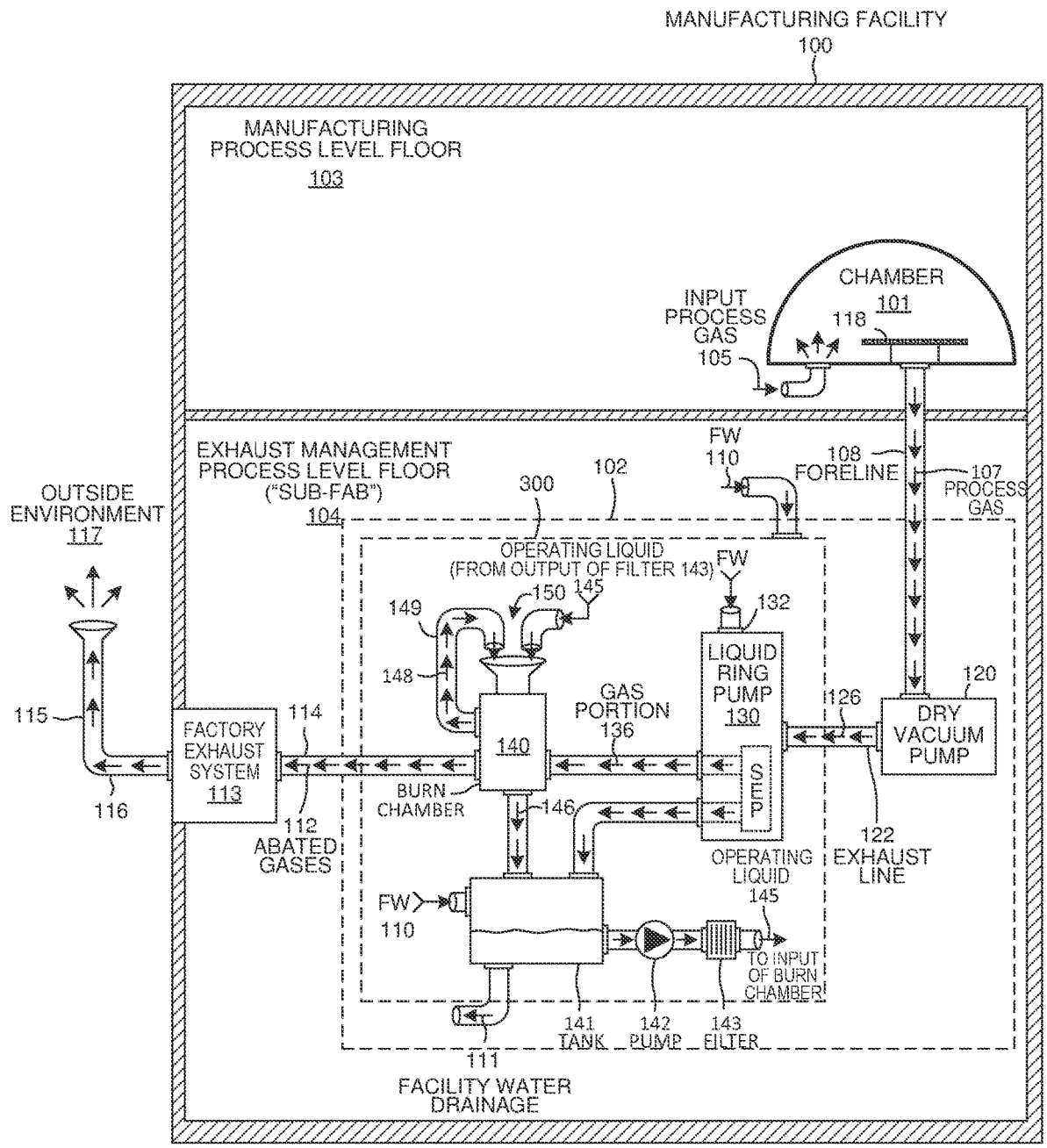
FIG. 7 is a high-level diagram of the manufacturing facility 100 that shows another embodiment of the abatement system with liquid-ring pump 300.

FIG. 7 is a high-level diagram of the manufacturing facility 100 that shows another embodiment of the abatement system with liquid-ring pump 300. The abatement system with liquid-ring pump 300 includes a liquid-ring pump 130, a burn chamber 140, a tank 141, a pump 142, and a filter 143. The no abatement system with liquid-ring pump 300 operates in a similar fashion as the abatement system with liquid-ring pump 121 shown in FIG. 5, except that the operating liquid 145 is supplied to the inlet port 150 of the burn chamber 140 instead of supplying the operating liquid 145 back into the liquid-ring pump 130. The liquid-ring pump 130 receives facility water 110 into the inlet port 132. The exhaust line 122 is maintained at a negative pressure during operation of the abatement system 300. The facility water 110 that is supplied to the second inlet port 132 of the liquid-ring pump 130 helps maintain and recirculate fluid through the liquid-ring pump 130, reducing the likelihood of buildup within the liquid-ring pump 130.

Figure 8:
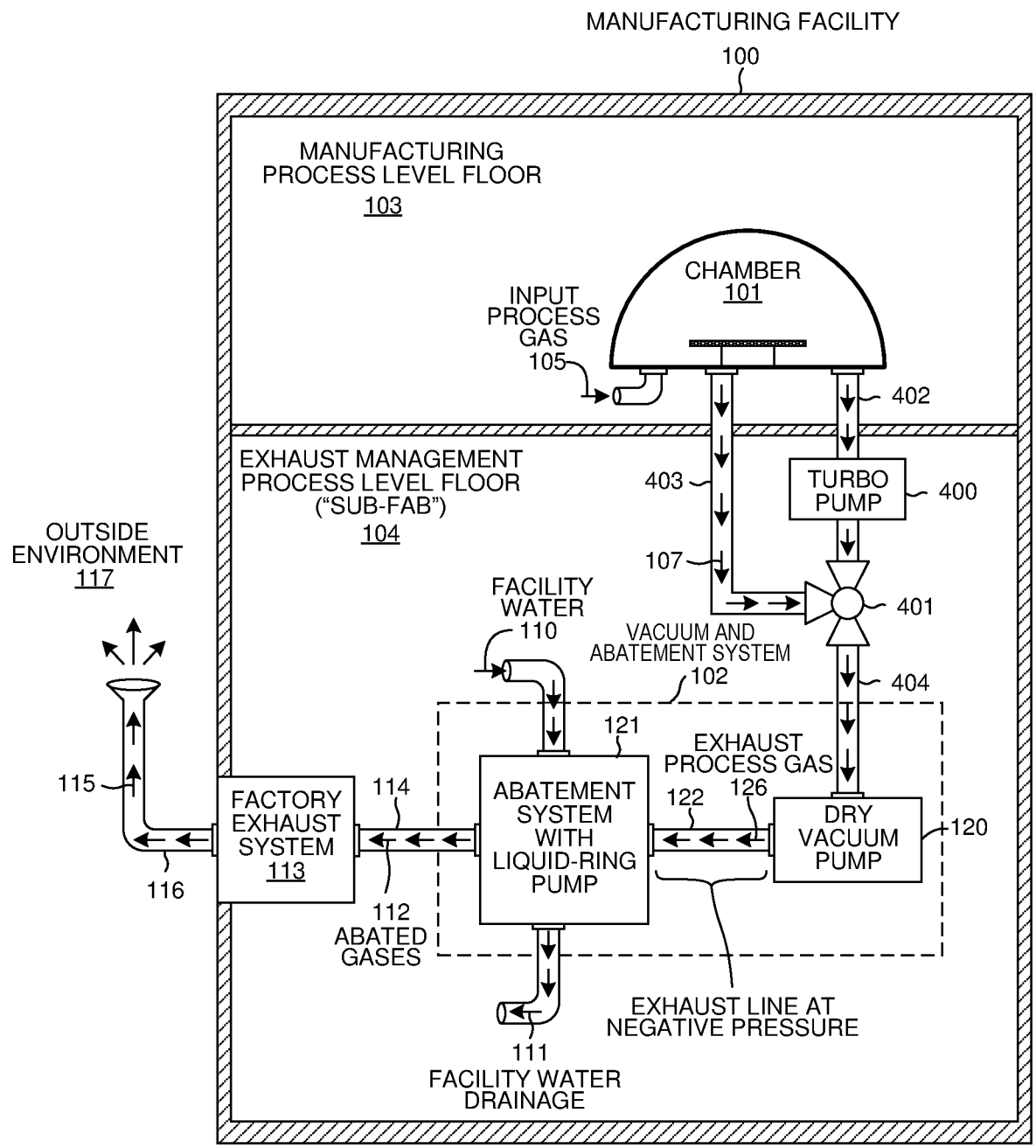
FIG. 8 is a high-level diagram of the manufacturing facility 100 that shows another embodiment in accordance with another novel aspect.

FIG. 8 is a high-level diagram of the manufacturing facility 100 that shows another embodiment in accordance with another novel aspect. Manufacturing facility 100 shown in FIG. 8 includes a turbo pump 400, a controllable valve 401, a first exhaust line 402, a second exhaust line 403, and a vacuum foreline 404. The embodiment of FIG. 8 is typically used in low-pressure processes, such as in PVD or etching applications.

During the initial stage when the vacuum condition is first being generated within the chamber 101, the turbo pump 400 operates to vacuum process gas 107 through the first exhaust line 402 through the controllable valve 401 and through the foreline 404 to the dry vacuum pump 120. After the vacuum condition is sufficient within chamber 101, the turbo pump 400 is deactivated and the second exhaust line 403 exhausts process gas 107 from chamber 101 through valve 401 and to the dry vacuum pump 120. The process chamber 101 in the embodiment of FIG. 8 is typically used in a PVD type of manufacturing process or other types of low-pressure processes.

FIG. 9 is a high-level diagram of another embodiment of a manufacturing facility 500. Manufacturing facility 500 includes a chamber 501 disposed within a manufacturing process area 502 and a novel vacuum and abatement system 503 disposed within an exhaust management process area 504. The exhaust management process area 504 is also referred to as a chase. In the embodiments shown in FIGS. 5-8, the exhaust management process level floor 104 (or the sub-fab) is disposed below the manufacturing process level floor 103. However, in the example of FIG. 9, the exhaust management process area 504 is on the same level as the manufacturing process area 502. The vacuum and abatement system 503 may be one of the various types shown in FIGS. 5-7.

Figure 10:
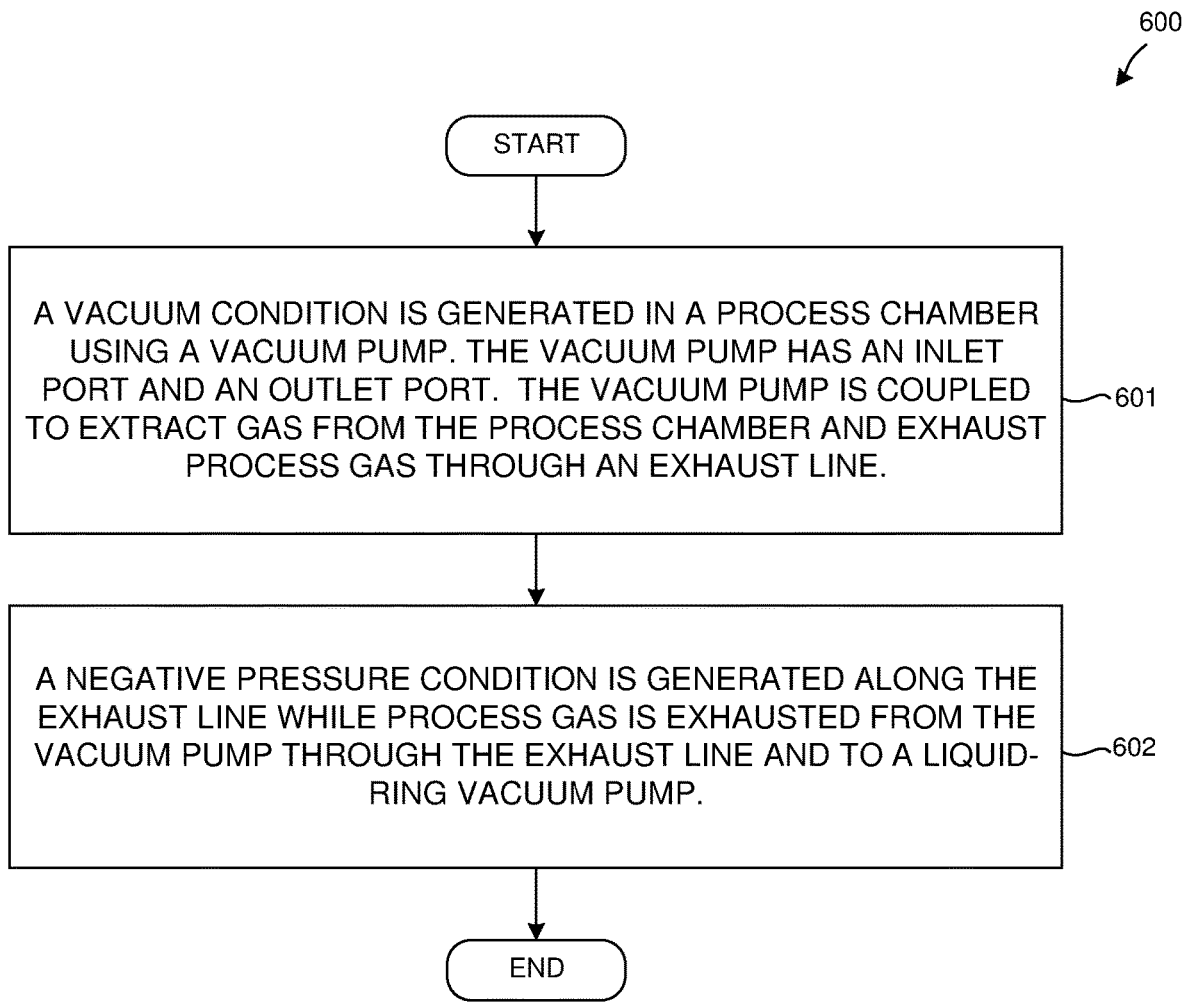
FIG. 10 is a flowchart of a method 600 in accordance with one novel aspect.

FIG. 10 is a flowchart of a method 600 in accordance with one novel aspect. In a first step (step 601), a vacuum condition is generated in a process chamber using a vacuum pump. The vacuum pump has an inlet port and an outlet port. The vacuum pump is coupled to extract gas from the process chamber and exhaust process gas through an exhaust line.

In a second step (step 602), a negative pressure condition is generated along the exhaust line while process gas is exhausted from the vacuum pump. The process gas is exhausted from the process vacuum pump through the exhaust line and to a liquid-ring pump. One example of the process chamber, the vacuum pump, and the liquid-ring pump is shown in FIGS. 5-8.

Although certain specific exemplary embodiments are described above in order to illustrate the invention, the invention is not limited to the specific embodiments. For example, although the liquid-ring pump is shown as part of the abatement system, in other embodiments, the liquid-ring pump is outside of the abatement system. In other embodiments, the dry vacuum pump and the liquid-ring pump are integrated into a single structure. Accordingly, various modifications, adaptations, and combinations of various features of the described embodiments can be practiced without departing from the scope of the invention as set forth in the claims.

What is claimed is:

1. A method comprising:
    generating a vacuum condition in a process chamber using a vacuum pump, wherein the vacuum pump has an inlet port and an outlet port, and wherein the vacuum pump is coupled to extract gas from the process chamber via the inlet port and exhaust gas through an exhaust line via the outlet port;
    generating a negative pressure condition along the exhaust line while gas is exhausted from the vacuum pump through the exhaust line and to a liquid-ring pump;
    supplying a gas portion of an exhaust process gas from liquid-ring pump to a burn chamber;
    supplying abated liquid from the burn chamber to a tank;
    filtering liquid stored in the tank thereby generating filtered liquid; and
    recycling filtered liquid back into the liquid-ring pump or the burn chamber.

2. The method of claim 1, the liquid-ring pump has a first inlet port, a second inlet port, a first outlet port, and a second outlet port, wherein the first inlet port of the liquid-ring pump is coupled to receive gas from the vacuum pump via the exhaust line, wherein the first outlet port of the liquid-ring pump outputs gas, and wherein the second outlet port of the liquid-ring pump is coupled to output liquid.

3. The method of claim 2, further comprising:
    supplying liquid collected during an abatement process to the second inlet port of the liquid-ring pump.

4. The method of claim 3, further comprising:
    exhausting gas from the abatement process to a factory exhaust system.

5. The method of claim 2, wherein the second inlet port of the liquid-ring pump is coupled to receive liquid from part of an abatement system.

6. The method of claim 5, wherein the liquid received via the second inlet port of the liquid-ring pump is supplied from frail the tank of an abatement system, and wherein the tank receives liquid output by the burn chamber during an abatement process.

7. The method of claim 2, wherein the first inlet port of the liquid-ring pump is a gas inlet port, wherein the second inlet port of the liquid-ring pump is an operating liquid inlet port, wherein the first outlet port of the liquid-ring pump is a gas discharge outlet port, and wherein the second outlet port of the liquid-ring pump is a liquid drain outlet port.

8. The method of claim 2, wherein the first outlet port of the liquid-ring pump is coupled to supply gas to the burn chamber of an abatement system.

9. The method of claim 2, wherein the second outlet port of the liquid-ring pump is coupled to supply liquid to the burn chamber of the abatement system.

10. The method of claim 2, wherein the second outlet port of the liquid-ring pump is coupled to supply liquid to frail the tank of an abatement system, and wherein the tank is coupled to receive liquid output by the burn chamber of the abatement system.

11. The method of claim 1, wherein during the generating of the negative pressure condition, the inlet port of the vacuum pump has a first pressure level and the outlet port of the vacuum pump has a second pressure level, wherein the first pressure level is lower than the second pressure level, and wherein the second pressure level is lower than atmospheric pressure.

12. The method of claim 1, wherein the vacuum pump is a dry vacuum pump, and wherein the liquid-ring pump is part of an abatement system.

13. A system comprising:
    a chamber;
    a foreline;
    a vacuum pump having an inlet port and an outlet port, wherein the inlet port of the vacuum pump is coupled to extract gas from the chamber via the foreline;
    an exhaust line;
    a liquid-ring pump having a first inlet port, a second inlet port, a first outlet port, and a second outlet port, wherein the first inlet port of the liquid-ring pump is coupled to receive gas from the vacuum pump via the exhaust line thereby causing a negative pressure condition along the exhaust line;
    a burn chamber;
    a storage tank, wherein the storage tank is coupled to receive liquid from the burn chamber; and
    a filter that filters liquid stored in the storage tank and generates filtered liquid, wherein the filtered liquid is input to the liquid-ring pump or the burn chamber.

14. The system of claim 13,
    wherein liquid stored in the tank is supplied to the second inlet port of the liquid-ring pump.

15. The system of claim 14, wherein the first outlet port of the liquid-ring pump is coupled to supply gas to the burn chamber of the abatement system.

16. The system of claim 14, wherein the second outlet port of the liquid-ring pump is coupled to supply liquid to the burn chamber of the abatement system.

17. The system of claim 13, wherein the vacuum pump is a dry vacuum pump, and wherein the liquid-ring pump is part of an abatement system.

18. The system of claim 13, wherein the first inlet port of the liquid-ring pump is a gas inlet port, wherein the second inlet port of the liquid-ring pump is an operating liquid inlet port, wherein the first outlet port of the liquid-ring pump is a gas discharge outlet port, and wherein the second outlet port of the liquid-ring pump is a liquid drain outlet port.

19. A system comprising:

a vacuum pump having an inlet port and an outlet port, wherein the inlet port of the vacuum pump is coupled to extract gas from a process chamber, and wherein the outlet port is coupled to exhaust gas exhausted from the process chamber through an exhaust line; and means for generating a negative pressure along the exhaust line while the gas is exhausted from the vacuum pump through the exhaust line, wherein liquid stored in a storage tank is filtered and recycled back into the means or back into a burn chamber of the system, and wherein the liquid is supplied from the burn chamber to the storage tank.

20. The system of claim 19, wherein the means is a liquid-ring pump.

\* \* \* \* \*